(12) United States Patent
Tezen et al.

(10) Patent No.: US 6,631,149 B1
(45) Date of Patent: Oct. 7, 2003

(54) LASER DIODE USING GROUP III NITRIDE GROUP COMPOUND SEMICONDUCTOR

(75) Inventors: Yuta Tezen, Aichi-ken (JP); Masayoshi Koike, Aichi-ken (JP)

(73) Assignees: Toyoda Gosei Co., Ltd., Aichi-ken (JP); Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 09/688,206

(22) Filed: Oct. 16, 2000

(30) Foreign Application Priority Data

Oct. 15, 1999 (JP) .......................................... 11-293265

(51) Int. Cl.$^7$ ................................................. H01S 5/00
(52) U.S. Cl. ............................................................. 372/43
(58) Field of Search ........................... 372/49, 43–46, 372/50

(56) References Cited

U.S. PATENT DOCUMENTS

| | | | | |
|---|---|---|---|---|
| 5,173,751 A | * | 12/1992 | Ota et al. ...................... | 257/76 |
| 5,523,589 A | * | 6/1996 | Edmond ....................... | 257/77 |
| 5,642,376 A | * | 6/1997 | Olbright et al. ............... | 372/99 |
| 5,670,798 A | * | 9/1997 | Schtzina ....................... | 257/96 |
| 5,889,295 A | * | 3/1999 | Rennie ........................ | 257/96 |
| 5,889,806 A | * | 3/1999 | Nagai .......................... | 372/45 |
| 5,959,307 A | * | 9/1999 | Nakamura .................... | 257/14 |
| 6,136,626 A | * | 10/2000 | Kidoguchi et al. ........... | 438/38 |
| 6,156,581 A | * | 12/2000 | Vaduo ......................... | 438/22 |
| 6,232,623 B1 | * | 5/2001 | Morita ....................... | 257/103 |
| 6,233,265 B1 | * | 5/2001 | Bour .......................... | 372/45 |
| 6,242,761 B1 | * | 6/2001 | Fujimoto ..................... | 257/94 |
| 6,285,696 B1 | * | 9/2001 | Bour .......................... | 372/45 |
| 6,285,698 B1 | * | 9/2001 | Romano et al. ............... | 372/46 |
| 6,459,096 B1 | * | 10/2002 | Razeghi ....................... | 257/14 |

FOREIGN PATENT DOCUMENTS

JP    H10-303493    11/1998

* cited by examiner

*Primary Examiner*—Paul Ip
*Assistant Examiner*—James Menefee
(74) *Attorney, Agent, or Firm*—McGinn & Gibb, PLLC

(57) ABSTRACT

A guide layer is formed to have a superlattice structure comprising five pairs of layers of AlGaN and InN, each having a thickness of about 10 nm. The guide layer has a total thickness of about 0.1 $\mu$m. The guide layer so structured has a reduced elastic constant such that the guide layer acts as a stress relieving layer.

20 Claims, 5 Drawing Sheets

FIG. 2 n-guide layer    105

| Si-doped InN | 10nm | $2 \times 10^{18}/cm^3$ |
|---|---|---|
| Si-doped $Al_{0.01}Ga_{0.99}N$ | 10nm | $2 \times 10^{18}/cm^3$ |
| Si-doped InN | 10nm | $2 \times 10^{18}/cm^3$ |
| Si-doped $Al_{0.01}Ga_{0.99}N$ | 10nm | $2 \times 10^{18}/cm^3$ |
| Si-doped InN | 10nm | $2 \times 10^{18}/cm^3$ |
| Si-doped $Al_{0.01}Ga_{0.99}N$ | 10nm | $2 \times 10^{18}/cm^3$ |
| Si-doped InN | 10nm | $2 \times 10^{18}/cm^3$ |
| Si-doped $Al_{0.01}Ga_{0.99}N$ | 10nm | $2 \times 10^{18}/cm^3$ |
| Si-doped InN | 10nm | $2 \times 10^{18}/cm^3$ |
| Si-doped $Al_{0.01}Ga_{0.99}N$ | 10nm | $2 \times 10^{18}/cm^3$ |

Each pair of rows = 1 period (5 periods total)

FIG. 3 active layer    106

| | | |
|---|---|---|
| well | $Ga_{0.85}In_{0.15}N$ | 3nm |
| barrier | GaN | 5nm |
| well | $Ga_{0.85}In_{0.15}N$ | 3nm |
| barrier | GaN | 5nm |
| well | $Ga_{0.85}In_{0.15}N$ | 3nm |
| barrier | GaN | 5nm |
| well | $Ga_{0.85}In_{0.15}N$ | 3nm |

FIG. 4 p-guide layer 107

| Mg-doped InN | 10nm | $5 \times 10^{17}/cm^3$ | ⎫ 1 period |
|---|---|---|---|
| Mg-doped $Al_{0.01}Ga_{0.99}N$ | 10nm | $5 \times 10^{17}/cm^3$ | ⎭ |
| Mg-doped InN | 10nm | $5 \times 10^{17}/cm^3$ | ⎫ 1 period |
| Mg-doped $Al_{0.01}Ga_{0.99}N$ | 10nm | $5 \times 10^{17}/cm^3$ | ⎭ |
| Mg-doped InN | 10nm | $5 \times 10^{17}/cm^3$ | ⎫ 1 period |
| Mg-doped $Al_{0.01}Ga_{0.99}N$ | 10nm | $5 \times 10^{17}/cm^3$ | ⎭ |
| Mg-doped InN | 10nm | $5 \times 10^{17}/cm^3$ | ⎫ 1 period |
| Mg-doped $Al_{0.01}Ga_{0.99}N$ | 10nm | $5 \times 10^{17}/cm^3$ | ⎭ |
| Mg-doped InN | 10nm | $5 \times 10^{17}/cm^3$ | ⎫ 1 period |
| Mg-doped $Al_{0.01}Ga_{0.99}N$ | 10nm | $5 \times 10^{17}/cm^3$ | ⎭ |

LASER DIODE USING GROUP III NITRIDE GROUP COMPOUND SEMICONDUCTOR

BACKGROUND OF THE INVENTION

1. Field of the Invention

The present invention relates to a laser diode using group III nitride group compound semiconductor. Here a group III nitride group compound semiconductor is represented by a general formula $Al_xGa_yIn_{1-x-y}N$ ($0 \leq x \leq 1$, $0 \leq y \leq 1$, $0 \leq x+y \leq 1$), which includes binary compounds such as AlN, GaN and InN, ternary compounds such as $Al_xGa_{1-x}N$, $Al_xIn_{1-x}N$ and $Ga_xIn_{1-x}N$ ($0<x<1$), and quaternary compounds such as $Al_xGa_yIn_{1-x-y}N$ ($0<x<1$, $0<y<1$, $0<x+y<1$). In this specification, a group III nitride group compound semiconductor includes a group III nitride group compound semiconductor which is doped with impurities to have p-type or n-type conductivity.

2. Description of the Related Art

A group III nitride group compound semiconductor is a direct-transition-type semiconductor having a wide emission spectrum range from ultraviolet to red, and is applied to light-emitting devices such as light-emitting diodes (LEDs) and laser diodes (LDs). The group III nitride group compound semiconductor is, in general, formed on a sapphire substrate. A laser diode, in general, comprises a guide layer and a cladding layer, which are formed on an n-type and a p-type semiconductor side of an active layer, respectively, sandwiching the same. The cladding layer is formed to have a large band gap and is generally made of $Al_xGa_{1-x}N$ ($0<x<1$) including aluminum (Al), in order that electrons and holes injected from the negative and the positive electrode, respectively, form electron-hole pairs in the active layer. The guide layer preferably has a wider band gap than the active layer. The guide layer is preferably made of, e.g., gallium nitride (GaN) in order that laser light can be confined in the active layer by total internal reflection due to the difference in refractive indices. The active layer preferably has a multiple quantum well (MQW) structure.

FIG. 5 illustrates the structure of a laser diode (LD) 900 as a conventional group III nitride group compound semiconductor light-emitting device. The laser diode (LD) 900 comprises a substrate 901, and an AlN buffer layer 902 is formed thereon.

On the buffer layer 902, the following four layers are formed successively: an n-layer 903 made of silicon (Si) doped GaN; an n-cladding layer 904 made of silicon (Si) doped $Al_xGa_{1-x}N$; an n-guide layer 905 made of silicon (Si) doped GaN; and an active layer 906 having a multiple quantum well (MQW) structure in which a barrier layer made of GaN and a well layer made of $Ga_{1-y}In_yN$ are laminated alternately. On the active layer 906, a p-guide layer 907 made of magnesium (Mg) doped GaN, a p-cladding layer 908 made of magnesium (Mg) doped $Al_xGa_{1-x}N$, and a p-contact layer 909 made of magnesium (Mg) doped GaN are formed. An electrode 910A is formed on the p-contact layer 909 and another electrode 910B is formed on a portion of the n-layer 903.

In the above-described conventional technique, however, stress between the sapphire substrate 901 and the n-layer 903 or the n-cladding layer 904 is applied to the active layer 906 through the n-guide layer 905. As a result, luminous efficiency of the active layer 906 decreases and oscillation threshold current of the laser increases.

SUMMARY OF THE INVENTION

An object of the present invention is, therefore, to provide a laser diode using group III nitride group compound semiconductor, which has a guide layer with decreased elastic constant.

To achieve the above object, and others, a first aspect of the present invention provides a laser diode using a group III nitride group compound semiconductor diode. The diode comprises a guide layer having a multiple layer structure including an indium nitride (InN) layer and is formed on a substrate side of an active layer.

A second aspect of the present invention provides a diode having a guide layer which has a multiple layer structure including an indium nitride (InN) layer which is disposed on the side of the active layer opposite to the substrate.

A laser diode using a group III nitride group compound semiconductor comprises a substrate and group III nitride group compound semiconductor layers laminated thereon. By forming a guide layer which has a multiple layer structure including an indium nitride (InN) layer and has a sufficiently lowered elastic constant beneath an active layer, the elastic constant of the guide layer becomes comparatively smaller. As a result, transmission of stress, which is generated by temperature variation during manufacture or use, can be prevented. When a guide layer which comprises a multiple layers including indium nitride (InN) is also formed on an active layer opposite to the substrate side, further improvement can be obtained. Because of the structure of the emission layer, the laser diode of the present invention can be used to produce ultraviolet light. The guide layers are preferably the multiple layers including InN and a group III nitride group compound semiconductor including no indium (In), for example, $Al_xGa_{1-x}N$ ($0 \leq x \leq 1$). For example, the guide layers preferably comprise the multiple layers including InN and $Al_xGa_{1-x}N$ ($0<x<1$) or, InN and GaN.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

FIG. 2 is a sectional view of an n-guide layer;

FIG. 3 is a sectional view of an active layer;

FIG. 4 is a sectional view of a p-guide layer; and

DETAILED DESCRIPTION OF THE INVENTION

The invention will be more fully understood by reference to the following embodiment, but not limited thereto.

Figure 1:
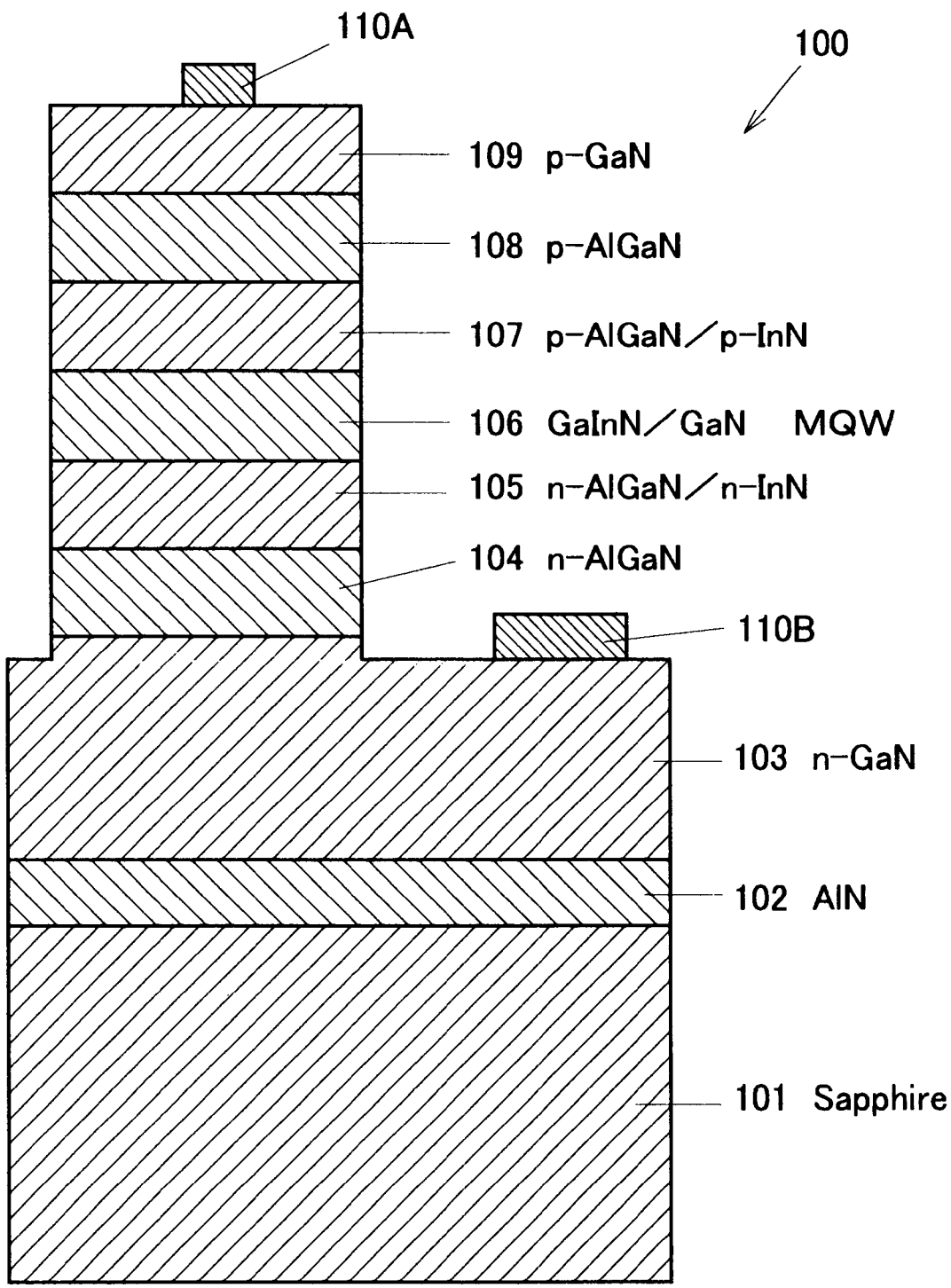
FIG. 1 is a sectional view of a laser diode 100 according to the embodiment of the present invention.

FIG. 1 illustrates a sectional view of a laser diode 100. The laser diode 100 has a sapphire substrate 101 on which about 50 nm in thickness of buffer layer 102 comprising, for example, AlN is formed.

About 5 $\mu$m in thickness of silicon (Si) doped GaN n-layer 103, having an electron concentration of $2 \times 10^{18}/cm^3$, is formed on the buffer layer 102. About 1 $\mu$m in thickness of silicon (Si) doped $Al_{0.08}Ga_{0.92}N$ n-cladding layer 104, having an electron concentration of $2 \times 10^{18}/cm^3$, is formed on the n-layer 103. About 100 nm in thickness of n-guide layer 105, having a multiple layer structure, is formed on the n-cladding layer 104. As shown in FIG. 2 the n-guide layer 105 comprises five pairs of layers. Each pair comprises a silicon (Si) doped $Al_{0.01}Ga_{0.99}N$ layer having a thickness of 10 nm and an electron concentration of $2\times10^{18}/cm^3$ and a silicon (Si) doped InN layer having a thickness of 10 nm and an electron concentration of $2\times10^{18}/cm^3$, laminated alternately.

An active layer 106 having a multiple quantum well (MQW) structure is formed on the n-guide layer 105. In the active layer 106, 4 well layers made of $Ga_{0.85}In_{0.15}N$, each having a thickness of about 3 nm, and three barrier layers made of GaN, each having a thickness of about 5 nm, are laminated alternately as shown in FIG. 3. About 100 nm in thickness of p-guide layer 107, having a multiple layer structure, is formed on the active layer 106. As shown in FIG. 4 the p-guide layer 107 comprises five pairs of layers. Each pair includes a magnesium (Mg) doped $Al_{0.01}Ga_{0.99}N$ layer, having a hole concentration of $5\times10^{17}/cm^3$ and a thickness of about 10 nm, and a magnesium (Mg) doped InN layer, having a hole concentration of $5\times10^{17}/cm^3$ and a thickness of about 10 nm.

About 1 $\mu$m in thickness of magnesium (Mg) doped $Al_{0.08}Ga_{0.92}N$ p-cladding layer 108, having a hole concentration of $5\times10^{17}/cm^3$, is formed on the p-guide layer 107. A magnesium (Mg) doped GaN p-contact layer 109, having a thickness of 300 nm and a hole concentration of $5\times10^{17}/cm^3$, is formed on the p-contact layer 109. An electrode layer 110A made of nickel (Ni) is formed on some portion of the p-contact layer 109. Another electrode 110B made of aluminum (Al) is formed on some portion of the n-layer 103.

One exemplary method for manufacturing this light-emitting device (semiconductor laser) is explained hereinafter. Each of the semiconductor layers of the light-emitting device 100 is formed by gaseous phase epitaxial growth, called metal organic vapor phase deposition (hereinafter MOVPE). The gases employed in this process are ammonia ($NH_3$), a carrier gas ($H_2$ or $N_2$), trimethyl gallium ($Ga(CH_3)_3$, hereinafter TMG), trimethyl aluminum ($Al(CH_3)_3$, hereinafter TMA), trimethyl indium ($In(CH_3)_3$, hereinafter TMI), silane ($SiH_4$), and biscyclopentadienyl magnesium ($Mg(C_5H_5)_2$, hereinafter $CP_2Mg$).

The single crystalline sapphire substrate 101 is placed on a susceptor in a reaction chamber for the MOVPE treatment after its "a"-surface is cleaned, for example, by an organic washing solvent and heat treatment. Then the sapphire substrate 101 is baked for about 30 min. at 1100° C. by $H_2$ vapor fed into the chamber at a flow rate of 2 L/min. under normal pressure.

About 50 nm in thickness of an AlN buffer layer 102 is formed on the cleaned "a"-surface of the baked sapphire substrate 101 under conditions controlled by lowering the temperature in the chamber to 400° C., keeping the temperature constant, and concurrently supplying $H_2$ at a flow rate of 10 L/min., $NH_3$ at 10 L/min., and TMA at 20 $\mu$mol/min. for about 90 seconds.

About 5 $\mu$m in thickness of Si-doped GaN is formed on the buffer layer 102, as an n-layer 103 with an electron concentration of $2\times10^{18}/cm^3$, under conditions controlled by keeping the temperature of the sapphire substrate 101 at 1150° C. and concurrently supplying $H_2$ at a flow rate of 10 L/min., $NH_3$ at 10 L/min., TMG at 200 $\mu$mol/min., and silane ($SiH_4$) diluted to 0.86 ppm by $H_2$ at 100 mol/min.

About 1 $\mu$m in thickness of $Al_{0.08}Ga_{0.92}N$ is formed on the n-layer 103, as an n-cladding layer 104, under conditions concurrently supplying $N_2$ or $H_2$, $NH_3$, TMA, TMG, and silane. ($SiH_4$).

About 10 nm in thickness of $Al_{0.01}Ga_{0.99}N$ is formed on the n-cladding layer 104, under conditions concurrently supplying $N_2$ or $H_2$, $NH_3$, TMA, TMG, and silane ($SiH_4$). About 10 nm in thickness of InN is formed under conditions lowering the temperature of the sapphire substrate 101 at 450° C. and concurrently supplying $N_2$ or $H_2$, $NH_3$, TMI, and silane ($SiH_4$). By repeating these processes, five pairs of $Al_{0.01}Ga_{0.99}N$ and InN layers are formed under the same conditions. As a result, an n-guide layer 105 with a multiple layer structure having a total of about 100 nm in thickness is obtained.

A $Ga_{0.85}In_{0.15}N$ layer about 3 nm thick is formed on the n-guide layer 105, as a well layer, while concurrently supplying $N_2$ or $H_2$, $NH_3$, TMG, and TMI. A layer of about 5 nm in thickness of GaN is formed on the well layer, as a barrier layer, under conditions concurrently supplying $N_2$ or $H_2$, $NH_3$, and TMG. Another two pairs of layers, each including a well layer and a barrier layer are laminated under the same conditions described above, and then about 3 nm in thickness of a $Ga_{0.85}In_{0.15}N$ well layer is formed thereon. Accordingly, an active layer 106 with a multiple quantum well (MQW) structure, having four repeated well layers with intervening barrier layers, is obtained.

An $Al_{0.01}Ga_{0.99}N$ layer about 10 nm thick is formed while concurrently supplying $N_2$ or, $H_2$, $NH_3$, TMG, TMI, and $CP_2Mg$. An InN layer, also about 10 nm thick, is formed under conditions lowering the temperature of the substrate to 45° C. and concurrently supplying $N_2$ or $H_2$, TMI, and $CP_2Mg$. By repeating these processes, five pairs in total of $Al_{0.01}Ga_{0.99}N$ layers and the TnN layers are formed on the active layer. As a result, about 100 nm in thickness of a p-guide layer 107 of a multiple layer structure is obtained. Likewise, about 1 $\mu$m in thickness of $Al_{0.08}Ga_{0.92}N$ layer, as a p-cladding layer 108, is formed under conditions concurrently supplying $N_2$ or $H_2$, $NH_3$, TMA, TMG, and $CP_2Mg$.

About 300 nm in thickness of magnesium (Mg) doped GaN is formed on the p-cladding layer 108, as a p-contact layer 109, under conditions controlled by keeping the temperature of the sapphire substrate 101 at 1100° C. and concurrently supplying $N_2$ or $H_2$ at a flow rate of 10 L/min., $NH_3$ at 10 L/min., TMG at 100 $\mu$mol/min., and $CP_2Mg$ at 2 $\mu$mol/min.

The three layers are substantially uniformly irradiated using an electron beam, preferably using a reflective electron beam diffraction device. The irradiating electrons are, for example, accelerated to 10 kV at a sample current of 1 $\mu$A. In this example, the beam is scanned at 0.2 mm/s and has a beam aperture of 60 $\mu$m$\phi$. The irradiation is preferably performed at a pressure of about 50 $\mu$Torr. By this irradiation the p-contact layer 109, the p-cladding layer 108, and the p-guide layer 107, have respective hole concentrations of $5\times10^{17}/cm^3$, $5\times10^{17}/cm^3$, and $5\times10^{17}/cm^3$. As a result, a wafer with a multiple layer structure is obtained.

An $SiO_2$ layer may be formed on the p-contact layer 109 by sputtering, and a photoresist layer may-be laminated on the $SiO_2$ layer prior to execution of the photolithography process. The photoresist layer of the electrode forming part on the n-layer 103 is removed and the $SiO_2$ layer, which is not covered by the photoresist layer, is removed, for example by using a hydrofluoric acid system etching solution.

Then, the p-contact layer 109, the p-cladding layer 108, the p-guide layer 107, the active layer 106, the n-guide layer 105, the n-cladding layer 104, and a portion of the n-layer 103, which are not covered by the photoresist layer and the $SiO_2$ layer, are dry-etched under conditions set at 0.04 Torr vacuum and at 0.44 W/cm² for a high-frequency power, concurrently supplying BCl₃ gas at a flow rate of 10 ml/min., and then dry-etched by using argon (Ar). In this manner, an electrode region is formed on the n-layer 103.

Nickel (Ni) is deposited on the p-contact layer 109, and an electrode 110A is formed thereon. Aluminum (Al) is deposited on the n-layer 103, and an electrode 110B is formed thereon.

Dry-etching is carried out in order to form a resonator facet. A scribing groove is formed in a scribing process. Then strips are obtained by dicing the in x-axis direction, which is parallel to the resonator facet. The thus-obtained laser-diode 100 is found to have an output power of 10 mW and an oscillation wavelength of 380 nm when driving voltage current supplied to the device is 1000 mA.

Figure 5:
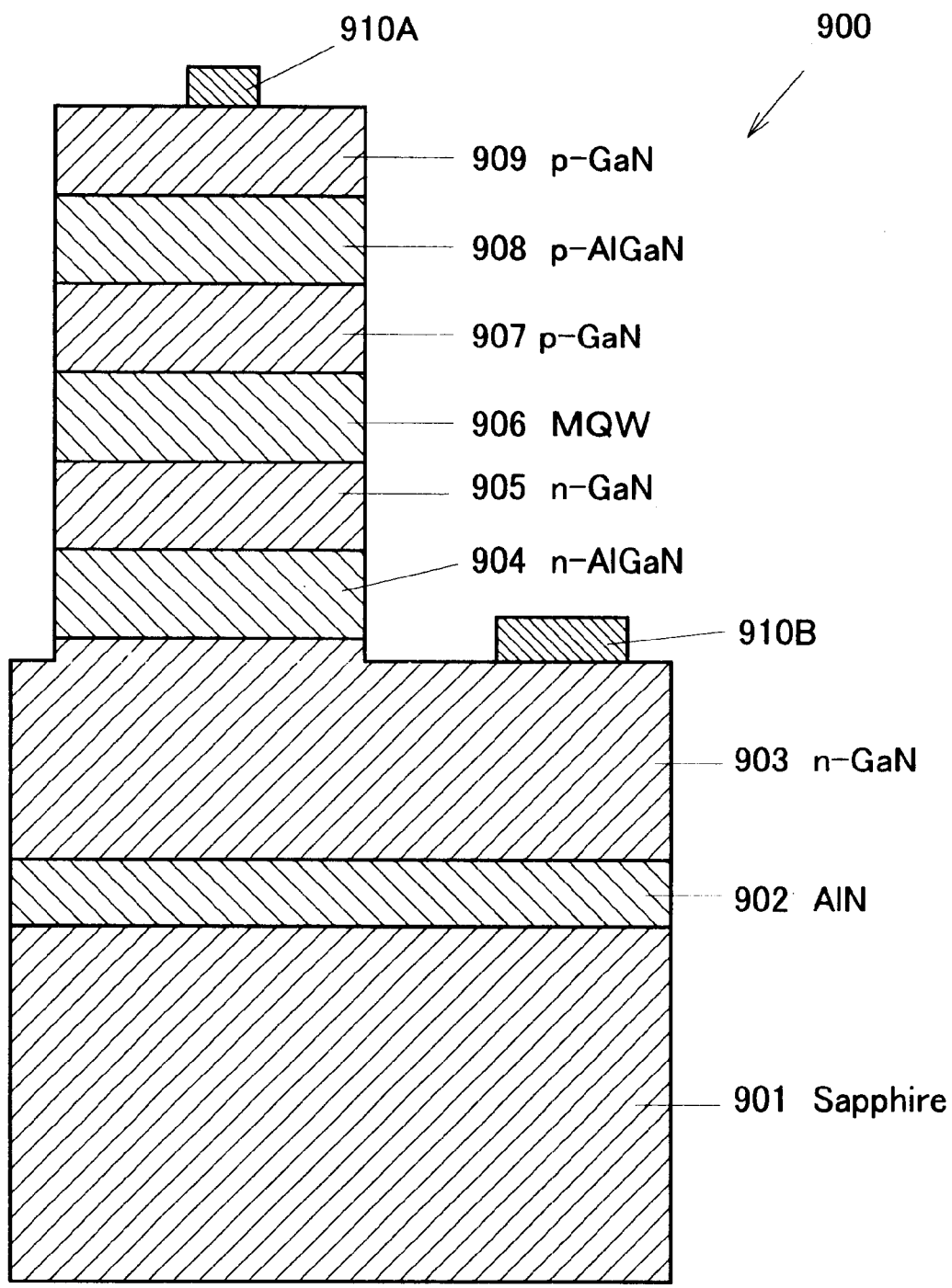
FIG. 5 is a sectional view of a conventional laser diode 900.

For comparison, a conventional laser diode 900 is formed as shown in FIG. 5. The laser diode 900 comprises a guide layer without a multiple layer structure, and the same layers each having the same thickness as those formed in the laser diode 100. That is, each composition ratio, materials, and thickness of a sapphire substrate 901, a buffer layer 902, an n-layer 903, an emission layer 906 having a multiple quantum well (MQW) structure, a p-contact layer 909, electrodes 910A and 910B formed in the conventional laser diode 900, and etching or other treatment of the laser diode 900 almost correspond to those of the laser diode 100. The n-guide layer 905 of the laser diode 900 is a silicon (Si) doped GaN having an electron concentration of $2\times10^{18}/cm^3$ and a thickness of 100 nm. The p-guide layer 907 of the laser diode 900 is a magnesium (Mg) doped GaN having a hole concentration of $5\times10^{17}/cm^3$ and a thickness of 100 nm. A conventional laser diode 900, manufactured according to the foregoing method, tends to be subject to stresses between layers and may, in fact, break when a driving voltage is applied.

In the above embodiments, the light-emitting device is manufactured by using metal organic chemical vapor deposition (MOCVD). Alternatively, a semiconductor layer can be formed by using such as molecular beam epitaxy (MBE), Halide vapor phase epitaxy, liquid phase epitaxy, or any other appropriate manufacturing method as understood by those skilled in the art.

In the above embodiments, a laser diode which has a multiple quantum well (MQW) structure emission layer is disclosed as an example. Alternatively, the light-emitting device can have a homojunction structure, a heterojunction structure, or a double heterojunction structure. These, structures can be formed through formation of, for example, a PIN junction or a p-n junction. Also, the emission layer can have a single quantum well (SQW) structure.

A sapphire substrate is employed in the above described embodiments. However, materials such as Si, SiC, MgAl₂O₄, ZnO, MgO, GaN, and other group III nitride group compound semiconductors may also be employed as a substrate for crystal growth. In the various embodiments, in order to grow the group III nitride group compound semiconductor having excellent crystallinity, a buffer layer is formed on the substrate for compensating the lattice mismatch between the substrate and the group III nitride group compound semiconductor. Even when the substrate is made of other materials, a buffer layer is preferably formed on the substrate. The buffer layer may be made of a group III nitride group compound semiconductor satisfying the formula $Al_xGa_yIn_{1-x-y}N$ ($0\leq x\leq 1$, $0\leq y\leq 1$, $0\leq x+y\leq 1$), which is formed at a low temperature. Preferably, the buffer layer is made of $Al_xGa_{1-x}N$ ($0\leq x\leq 1$).

The group III nitride group compound semiconductor can be also made of a group III nitride group compound in which a part of the group III element is changed to boron (B) or thallium (Tl), and a part of the nitrogen (N) is changed to phosphorus (P), arsenic (As), antimony (Sb), bismuth (Bi), and so on. When the group III nitride group compound semiconductor functions as a light-emitting device, a binary or a ternary group III nitride group compound semiconductor may be preferably employed.

Group III nitride group compound semiconductor composition ratios of the layers in the guide layers 105 and 108 having a multiple layer structure and well and barrier layers in the active layer having multiple quantum well (MQW) structure are not limited to the above embodiments. Alternatively, a group III nitride group compound semiconductor satisfying the formula $Al_xGa_yIn_{1-x-y}N$ ($0\leq x\leq 1$, $0\leq y\leq 1$, $0\leq x+y\leq 1$) can be employed to form each sublayer layer in the guide layers 105 and 108 and the active layer 106. The layers need not have identical compositions and may each have different aluminum composition x, gallium composition y, and indium composition 1−x−y.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A laser diode comprising a group III nitride group compound semiconductor, comprising:
   a substrate;
   an active layer disposed on one side of said substrate; and
   a guide layer, having a multiple layer structure comprising an indium nitride (InN) layer, said guide layer being disposed on a substrate side of said active layer and preventing stress from being transmitted to said active layer,
   wherein said guide layer comprises a layer comprising $Al_xGa_{1-x}N/InN$ and having a multiple layer structure, wherein $0\leq x\leq 1$, each layer in said multiple layer structure having a different composition ratio x.

2. A laser diode according to claim 1, further comprising:
   a cladding layer comprising n-$Al_{z1}Ga_{1-z1}N$ formed on a substrate side of said active layer; and
   a cladding layer comprising p-$Al_{z2}Ga_{1-z2}N$, formed on a side of said active layer which is opposite said substrate,
   wherein $0\leq z1\leq 1$ and $0\leq z2\leq 1$.

3. A laser diode according to claim 2, further comprising:
   a contact layer comprising n-GaN formed on a substrate side of said active layer, and a
   contact layer comprising p-GaN, formed on a side of said active layer which is opposite said substrate.

4. A laser diode according to claim 1, wherein said guide layer comprises a multiple layer structure including InN and a group III nitride group compound semiconductor including no indium (In).

5. A laser diode according to claim 1, wherein said active layer comprises a layer comprising $Ga_yIn_{1-y}N/GaN$ and having a multiple quantum well structure, wherein $0\leq y\leq 1$.

6. A laser diode according to claim 1, including another guide layer having a multiple layer structure, said another guide layer comprising a layer comprising indium nitride (InN) and disposed on a side of said active layer opposite to said substrate.

7. A laser diode according to claim 6, wherein said another guide layer comprises a layer comprising $Al_xGa_{1-x}N/InN$ and having a multiple layer structure, wherein $0\leq x\leq 1$.

8. A laser diode according to claim 6, wherein said active layer comprises a layer comprising $Ga_yIn_{1-y}N/GaN$ and having a multiple quantum well structure, wherein $0 \leq y \leq 1$.

9. A laser diode according to claim 6, wherein said another guide layer comprises a multiple layer structure including InN and a group III nitride group compound semiconductor including no indium (In).

10. A laser diode according to claim 6, further comprising:
   a cladding layer comprising n-$Al_{z2}Ga_{1-z2}N$ formed on a substrate side of said active layer; and
   a cladding layer comprising p-$Al_{z2}Ga_{1-z2}N$ formed on a side of said active layer which is opposite said substrate,
   wherein $0 \leq z1 \leq 1$ and $0 \leq z2 \leq 1$.

11. A laser diode according to claim 10, further comprising:
   a contact layer comprising n-GaN formed on a substrate side of said active layer; and a
   contact layer comprising p-GaN, formed on a side of said active layer which is opposite said substrate.

12. A laser diode comprising:
   a substrate;
   an active layer disposed on a side of said substrate; and
   at least one guide layer adjacent to said active layer, and comprising:
      at least one indium nitride layer; and
      a plurality of layers comprising $Al_xGa_yIn_{1-x-y}N$ ($0 \leq x \leq 1$, $0 \leq y \leq 1$, $0 \leq x+y \leq 1$), at least two layers in said plurality of layers having different composition ratios.

13. A laser diode according to claim 12, wherein said plurality of layers comprises an $Al_{0.01}Ga_{0.99}N$ layer.

14. A laser diode according to claim 12, wherein said plurality of layers is devoid of indium.

15. A laser diode according to claim 12, wherein said plurality of layers comprises a GaN layer.

16. A laser diode according to claim 12, wherein said plurality of layers comprises at least one of different aluminum compositions, gallium compositions, and indium compositions.

17. A laser diode according to claim 12, wherein said at least one guide layer comprises an n-guide layer formed on a substrate side of said active layer, and a p-guide layer formed on a side of said active layer which is opposite said substrate.

18. A laser diode according to claim 17, wherein said n-guide layer comprises five pairs of silicon-doped layers, each layer having a thickness of about 10 nm and an electron concentration of about $2 \times 10^{18}/cm^3$.

19. A laser diode according to claim 17, wherein said p-guide layer comprises five pairs of magnesium-doped layers, each layer having a thickness of about 10 nm and a hole concentration of about $5 \times 10^{17}/cm^3$.

20. A method of fabricating a laser diode comprising:
   forming an active layer on a side of a substrate; and
   forming at least one guide layer adjacent to said active layer, said at least one guide layer comprising:
      at least one indium nitride layer; and
      a plurality of layers comprising $Al_xGa_yIn_{1-x-y}N$ ($0 \leq x \leq 1$, $0 \leq y \leq 1$, $0 \leq x+y \leq 1$), at least two layers in said plurality of layers having different composition ratios.

* * * * *